United States Patent [19]

Smith

[11] 4,037,309
[45] July 26, 1977

[54] METHODS FOR MAKING TRANSISTOR STRUCTURES

[75] Inventor: George Elwood Smith, Murray Hill, N.J.

[73] Assignee: Bell Telephone Laboratories, Incorporated, Murray Hill, N.J.

[21] Appl. No.: 738,355

[22] Filed: Nov. 3, 1976

Related U.S. Application Data

[60] Division of Ser. No. 560,590, March 21, 1975, abandoned, which is a continuation-in-part of Ser. No. 485,962, July 5, 1974, abandoned.

[51] Int. Cl.² .................................................. B01J 17/00
[52] U.S. Cl. .......................................... 29/571; 29/578; 29/591; 357/23
[58] Field of Search .................... 29/571, 578, 591; 357/23

[56] References Cited

U.S. PATENT DOCUMENTS 3,514,844  6/1970  Bower ..................................... 29/571
3,699,646  10/1972  Vadasz ................................... 29/571

OTHER PUBLICATIONS

Neus Aus Der Technik, Feb. 1972, vol. 1, pp. 1 & 2, "Preparation of Semiconductor Components with Narrow-Semiconducting Regions, etc.".

Primary Examiner—W. Tupman
Attorney, Agent, or Firm—Irwin Ostroff

[57] ABSTRACT

In one embodiment, an extremely short channel FET is made by forming a metal layer over a wafer, depositing silicon dioxide over part of the metal layer, oxidizing the exposed metal, controllably etching a portion of the silicon dioxide to expose a small strip of the nonoxidized metal layer, electroplating the exposed metal strip, thereby to form an extremely narrow gate electrode, removing the deposited SiO₂, the metal oxide and the remaining metal layer to leave only the gate electrode, and using the gate electrode as a mask for ion implanting source and drain regions. Since the gate electrode can be made so narrow, the channel region is correspondingly short to give extremely high frequency capabilities. Other embodiments are also described.

4 Claims, 3 Drawing Figures

METHODS FOR MAKING TRANSISTOR STRUCTURES

CROSS-REFERENCE TO RELATED APPLICATION

This application is a division of the copending application Ser. No. 560,590 (G. E. Smith 35) filed Mar. 21, 1975 and assigned to Bell Telephone Laboratories, Incorporated, now abandoned, which is a continuation-in-part of Ser. No. 485,962 (G. E. Smith 34) filed July 5, 1974, assigned to Bell Telephone Laboratories, Incorporated, and now abandoned.

BACKGROUND OF THE INVENTION

This invention relates to methods for making transistor structures, and more particularly, to methods for making transistors having impurity regions separated by extremely small lateral distances.

Because of its ease of fabrication, the field effect transistor (FET) is finding widespread use in integrated circuit technology. The most common FET is one using source and drain regions on the surface of a silicon wafer separated by a channel region through which current is controlled by a gate electrode overlying the channel region and insulated from it by a thin layer of silicon dioxide. These devices lend themselves to large scale integrated circuit fabrication techniques because all of the source and drain regions can be made by simultaneous impurity diffusions or implantations, and relatively large packing densities can be achieved. One drawback is that their electronic speed of operation is limited by the difficulty of making a short channel over which a gate electrode can be accurately registered.

A device that is structurally related to the FET is the lateral bipolar transistor in which emitter and collector regions on the surface of a wafer are separated by a short base region. The applicability of these devices are limited by the difficulty in making a sufficiently short base region on the surface of the wafer.

SUMMARY OF THE INVENTION

I have found that short channel FETs, and bipolar transistors having short base regions, can be made by using an edge of a semiconductor mask as a reference location for defining an extremely short lateral distance. Various techniques will be described by which the edge of a first mask is used to determine a first impurity region, and as a reference location for a second mask, the second mask having a second edge a short lateral distance from the first impurity region. This second edge is then used to define a second impurity region removed a short lateral distance from the first impurity region. The closely spaced impurity regions define a short channel region of an FET or a short base region in a lateral bipolar transistor.

A specific embodiment for implementing this principle is succinctly described in the Abstract of the Disclosure and will not be repeated. A significant consequence of that particular technique is that the gate electrode is inherently accurately registered over the extremely short channel region. Another consequence is that the device is susceptible to mass production and to large scale integrated circuit techniques so that arrays of high speed FETs can be made on a single semiconductor chip.

Other embodiments, objects, features and advantages of the invention will be better understood from a consideration of the following description taken in conjunction with the accompanying drawing.

DRAWING DESCRIPTION

FIGS. 1 through 3 illustrate an embodiment of the invention.

DETAILED DESCRIPTION

Figure 1:
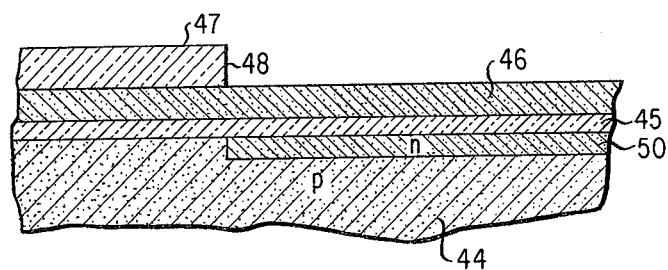

Referring to FIG. 1, a p-type wafer 44 is covered with a thin layer of silicon dioxide 45 and a deposited silicon layer 46. A silicon nitride mask 47 having an edge 48 is deposited over layer 46 using conventional masking techniques. The layer 47 then acts as a mask during ion implantation of an n-type collector region 50.

Figure 2:
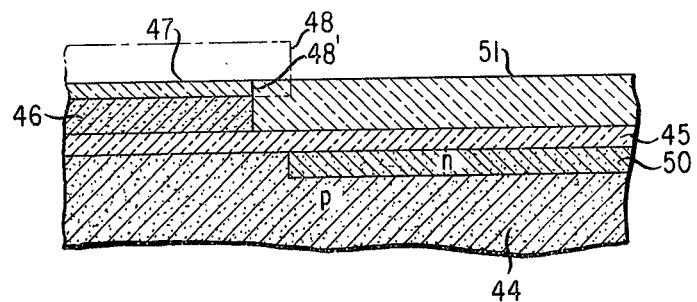

Refereing to FIG. 2, the silicon nitride layer 47 is next exposed to a selective etch which moves the edge of the layer 47 to location 48', a short lateral distance from the diffused collector region 50. Next, the silicon layer 46 of FIG. 1 is oxidized to form a silicon dioxide layer 51 which abuts against edge 48'. As is known, silicon nitride may be selectively etched at 70-80 Angstroms per minute by a 160 degrees C solution of $H_3PO_4$.

Figure 3:
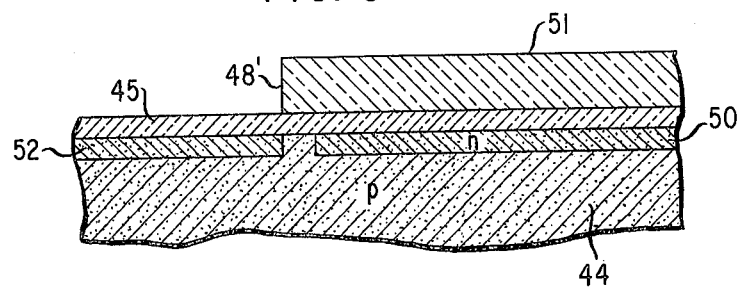

Referring to FIG. 3, the silicon nitride layer 47 is next removed by a selective etch, as is the remaining silicon layer 46 of FIG. 2. This leaves only the thin oxide layer 45 and the thick silicon dioxide layer 51 having an edge 48' corresponding to the same displaced location shown in FIG. 2. Using layer 51 as a mask, emitter region 52 is then defined by ion implantation, it being appropriately displaced from collector region 50 by a distance corresponding to the lateral displacement of edges 48 and 48' of FIGS. 1 and 2. Since there is no automatic registration of a gate electrode, this process is favored for making a lateral bipolar transistor rather than an FET. However, a reregistered gate could be applied to make an FET.

The foregoing embodiments are to be considered as merely illustrative of the inventive concepts. The various materials and their corresponding etchants are illustrative of various such materials, as are the conductivities and implant processes. Diffusion could be used in certain instances rather than ion implantation and it may be used in conjunction with ion implantation. Various other embodiments and modifications may be made by those skilled in the art without departing from the spirit and scope of the invention.

What is claimed is:

1. A method for making transistors comprising the steps of:
    forming over a semiconductor substrate a first mask having an exposed portion which includes a first vertical edge;
    forming a first impurity region in the substrate at a location defined by the first vertical edge of the first mask;
    controllably removing a portion of the first mask, including the portion of the first mask which defines the first vertical edge, to define a second vertical edge laterally removed a controlled distance from the location of the first edge;
    forming over the semiconductor substrate a second mask having a first vertical edge at a location corresponding to the location of the second vertical edge of the first mask; and
    forming a second impurity region in the substrate at a location defined by the first edge of the second mask.

2. The method of claim 1 wherein the first mask comprises a layer of silicon nitride (e.g., 47).

3. The method of claim 2 wherein the first mask is used as an ion implantation mask and ion implantation is used to form the first impurity region.

4. The method of claim 1 further comprising the steps of:

ion implanting the first impurity region (e.g., 50) using the first mask (e.g., 47) as an ion implantation mask;

forming a second mask (e.g., 51) after defining the second edge (e.g., 48); and ion implanting the second impurity region (e.g., 52), using the second mask (e.g., 51) as an ion implantation mask.

* * * * *